(12) United States Patent
Inamoto et al.

(10) Patent No.: US 7,079,400 B2
(45) Date of Patent: Jul. 18, 2006

(54) HIGH-FREQUENCY CIRCUIT

(75) Inventors: Tatsunobu Inamoto, Yao (JP); Jiro Miyahara, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 338 days.

(21) Appl. No.: 10/772,314

(22) Filed: Feb. 6, 2004

(65) Prior Publication Data
US 2004/0155712 A1    Aug. 12, 2004

(30) Foreign Application Priority Data
Feb. 12, 2003   (JP) ............................. 2003-033622

(51) Int. Cl.
*H05K 1/18*   (2006.01)
(52) U.S. Cl. ...................... 361/778; 361/777; 333/185
(58) Field of Classification Search ........ 174/255–260; 361/760–763, 777–780; 257/690–692, 728–730; 333/1, 185
See application file for complete search history.

(56) References Cited

U.S. PATENT DOCUMENTS

| 5,325,072 A | * | 6/1994 | Kohjiro et al. | 330/286 |
| 5,777,277 A | * | 7/1998 | Inagawa | 174/265 |
| 5,907,265 A | * | 5/1999 | Sakuragawa et al. | 333/1 |

FOREIGN PATENT DOCUMENTS

JP    2002-164701 A    6/2002

* cited by examiner

*Primary Examiner*—Kammie Cuneo
*Assistant Examiner*—Tuan Dinh
(74) *Attorney, Agent, or Firm*—Birch, Stewart, Kolasch and Birch, LLP

(57) ABSTRACT

A high-frequency circuit comprises a substrate having an electronic component on an obverse side thereof, a first ground pattern formed on almost an entire reverse side of the substrate, a microstrip line formed on the obverse side of the substrate, and a bias line connected to the electronic component on the obverse side of the substrate and formed continuously on the obverse side and the reverse side of the substrate so as to cross the microstrip line on the reverse side of the substrate in plan view so as to supply a bias voltage to the electronic component, wherein the first ground pattern is formed so as to circumvent the bias line formed on the reverse side of the substrate, a portion of the first ground pattern that circumvents the bias line on the reverse side of the substrate is continuously formed on the obverse side of the substrate as a second ground pattern so as to divide the microstrip line in two parts, and a chip jumper is arranged to bridge the two divided parts of the microstrip line over the second ground pattern so as to connect the divided microstrip line electrically.

16 Claims, 9 Drawing Sheets

HIGH-FREQUENCY CIRCUIT

This non-provisional application claims priority under 35 U.S.C. § 119(a) on Patent Application No. 2003-033622 filed in Japan on Feb. 12, 2003, the entire contents of which are hereby incorporated by reference.

BACKGROUND OF THE INVENTION

1. Field of the Invention

The present invention relates to a high-frequency circuit for use in a low-noise high-frequency amplifier or the like of a low-noise block down-converter used for satellite broadcasting. The present invention, particularly, relates to a high-frequency circuit having bias lines that cross a microstrip line, and to a high-frequency circuit having a plurality of microstrip lines for transmitting a plurality of signals wherein the microstrip lines are arranged to form one or more intersections with one another.

2. Description of the Prior Art

A part of a low-noise high-frequency amplifier used in an LNB (low-noise block down-converter) that receives a signal from a broadcasting satellite or a communications satellite and outputs an intermediate-frequency signal after frequency conversion is shown in FIG. 8 as an example of a conventional high-frequency circuit. A low-noise high-frequency amplifier 10 of the LNB comprises a MIC (microwave integrated circuit) having a substrate, microstrip lines 14L and 14R formed thereon, and elements built in the microstrip lines.

After received by an antenna (not illustrated), radio-frequency signals in a 12 GHz frequency band in the form of left-handed polarized wave and right-handed polarized wave are fed to the microstrip lines 14L and 14R through input terminals 11L and 11R thereof respectively.

The input signal in the form of left-handed polarized wave fed through the input terminal 11L is outputted from an output terminal 12L after having been amplified by two amplifiers 13L1 and 13L2, both of which are built in the microstrip line 14L. The input signal in the form of right-handed polarized wave fed through the input terminal 11R is outputted from an output terminal 12R after having been amplified by two amplifiers 13R1 and 13R2, both of which are built in the microstrip line 14R.

Each of the amplifiers 13L1, 13L2, 13R1, and 13R2 comprises a GaAsFET (Gallium Arsenide Field-Effect Transistor). Between the amplifiers 13L1 and 13L2 in the microstrip line 14L is formed a coupling capacitor C0 for preventing a DC (direct current) component from passing therethrough.

The amplifiers 13L1 and 13L2 are designed to amplify a signal fed to a gate G thereof and output the amplified signal from a drain D thereof when, for example, bias voltages −B1 and +B1 are applied to the gate G and the drain D by way of bias lines 16L1 and 16L2 respectively. In this case, a source of the GaAsFET is connected to ground (not illustrated).

Coupling capacitors C1 to C5 are formed in the microstrip line 14R to separate the bias lines 16L1, 16L2, 16R1, and 16R2 from each other as independent DC lines. The amplifiers 13R1 and 13R2 are designed to amplify a signal fed to a gate G thereof and output the amplified signal from a drain D thereof when, for example, bias voltages −B2 and +B2 are applied to the gate G and the drain D respectively. In this case, a source of the GaAsFET is connected to ground (not illustrated).

However, according to the aforementioned low-noise high-frequency amplifier 10, the microstrip lines 14L and 14R formed on the substrate are made thin and, in addition, a width W thereof is also made smaller so as to increase an overall packaging density. As a result, facing electrodes of each capacitor should be made longer in the longitudinal direction of the microstrip line 14R so that each of the capacitors C1 to C5 has a predetermined capacitance.

Accordingly, the microstrip line 14R becomes longer and, as a result, the bias lines 16L1 and 16L2 are spaced out apart from each other. Consequently, the overall length of the microstrip line 14L also becomes longer, resulting in an unduly larger low-noise high-frequency amplifier 10 in size. A similar drawback is also seen even in a case where the capacitors C1 to C5 can be formed without elongating the facing electrodes thereof in the longitudinal direction of the microstrip line 14R, because the gaps lying between the facing electrodes are added up to an existing length thereof.

Not only such a circuit as the aforementioned low-noise high-frequency amplifier 10, but also any high-frequency circuit having bias lines that cross a microstrip line requires capacitors for separating each bias line as an independent DC line, thereby making the high-frequency circuit still unduly large in size.

To solve the above-mentioned problem, the Japanese Patent Application Laid-Open No. 2002-164701 discloses a structure in which bias lines cross a microstrip line in plan view by routing a part of the bias lines on a reverse side of a substrate.

However, according to the conventional technology disclosed in the Japanese Patent Application Laid-Open No. 2002-164701, a bandwidth of the microstrip line becomes narrower because a ground plane for the microstrip line is made discontinuous. In other words, the conventional technology has a problem of preventing a wider bandwidth necessary for the high-frequency circuit from being realized. Details are described hereunder with reference to FIG. 9.

FIG. 9 is a sectional view showing a portion where a bias line 16L1 and a microstrip line 14R of the conventional low-noise high-frequency amplifier cross each other. It is to be noted that a bias line 16L2 and the microstrip line 14R cross each other in an identical manner. The microstrip line 14R is formed on an obverse side of a substrate 20. Portions of the bias lines 16L1 and 16L2 that are formed on the obverse side are electrically connected continuously to portions of the bias lines 16L1 and 16L2 that are formed on the reverse side by way of through holes 17 respectively. In FIG. 9, a reference numeral 18 is a ground pattern formed on almost an entire reverse side of the substrate 20, and the ground pattern 18 is removed from a portion surrounding the bias lines 16L1 and 16L2 that are formed on the reverse side of the substrate 20.

Accordingly, routing the bias lines 16L1 and 16L2 on a side opposite to a side on which microstrip line 14R is routed means that the ground pattern 18 is disrupted by the bias lines 16L1 and 16L2, causing discontinuity of the ground plane for the microstrip line 14R. This causes a phenomenon in which the bandwidth of the microstrip line 14R is made narrower.

Further, there are cases in which a substrate used for transmitting a plurality of signals has signal lines (microstrip lines) some of which are arranged to cross other signal lines. In one of such cases, crossing means is achieved by connecting portions of one of the microstrip lines with a chip jumper and routing another microstrip line under the chip jumper so that the microstrip lines cross each other. In another of such cases, one of the microstrip lines is routed on the obverse side and another microstrip line is routed on the reverse side so that the microstrip lines cross each other. In either case, the ground plane is discontinued at the crossing region causing the bandwidth to become narrower and a trap to be generated within the used bandwidth. Particularly, crossed microstrip lines often cause adverse effects such as crosstalk of a signal transmitted through one of the microstrip lines into a signal transmitted through another microstrip line. This could cause deterioration in performance.

SUMMARY OF THE INVENTION

An object of the present invention is, in light of the aforementioned problems, to provide a high-frequency circuit that can be made compact and work on a wide frequency band even in the case where bias lines cross a microstrip line or a microstrip line crosses another microstrip line.

To achieve the above object, according to one aspect of the present invention, a high-frequency circuit comprises a substrate having an electronic component on an obverse side thereof, a first ground pattern formed on almost an entire reverse side of the substrate, a microstrip line formed on the obverse side of the substrate, and a bias line connected to the electronic component on the obverse side of the substrate and formed continuously on the obverse side and the reverse side of the substrate so as to cross the microstrip line on the reverse side of the substrate in plan view so as to supply a bias voltage to the electronic component, wherein the first ground pattern is formed so as to circumvent the bias line formed on the reverse side of the substrate, a portion of the first ground pattern that circumvents the bias line on the reverse side of the substrate is continuously formed on the obverse side of the substrate as a second ground pattern so as to divide the microstrip line in two parts, and a chip jumper is arranged to bridge the two divided parts of the microstrip line over the second ground pattern so as to connect the divided microstrip line electrically.

In this structure, a coupling capacitor built in the microstrip line for separating the bias line as a DC line by way of which a bias voltage is supplied is not required even if the bias line and the microstrip line cross each other. As a result, it is possible to shorten the microstrip line and miniaturize the high-frequency circuit. It is also possible to realize a high-frequency circuit suitable for a wideband use, because the ground pattern for the microstrip line is prevented from becoming discontinuous.

According to another aspect of the present invention, a plurality of bias lines are formed so as to cross, in plan view, the chip jumper arranged to bridge the two divided parts of the microstrip line. In this arrangement, it is possible to arrange the bias lines in higher density, secure a wide area for placing other electronic components in the high-frequency circuit, and thereby achieve high packaging density of the high-frequency circuit.

According to still another aspect of the present invention, a high-frequency circuit has a substrate a substrate, a first ground pattern formed on almost an entire reverse side of the substrate, and a first microstrip line and a second microstrip line formed on the substrate, wherein the first microstrip line is formed on an obverse side of the substrate, the second microstrip line is formed continuously on the obverse side and the reverse side of the substrate so as to cross the first microstrip line on the reverse side of the substrate in plan view, the first ground pattern is formed so as to circumvent the second microstrip line formed on the reverse side of the substrate, a portion of the first ground pattern that circumvents the first microstrip line on the reverse side of the substrate is continuously formed on the obverse side of the substrate as a second ground pattern so as to divide the first microstrip line in two parts, and a chip jumper is arranged to bridge the two divided parts of the first microstrip line over the second ground pattern so as to electrically connect the divided two parts of the first microstrip line.

In this structure, it is possible to adopt the present invention into a high-frequency circuit in which a microstrip line is so arranged as to cross another microstrip line, provide a wide bandwidth without narrowing a bandwidth for a signal propagating through the microstrip line, and thereby realize a high-frequency circuit that allows a high-density packaging. It is also possible to reduce interference at the intersection between signals propagating through the microstrip lines that are arranged to cross each other.

According to still another aspect of the present invention, a plurality of second microstrip lines are formed so as to cross, in plan view, the chip jumper arranged to bridge the two divided parts of the first microstrip line. In this arrangement, it is possible to arrange the second microstrip lines in higher density, secure a wide area for placing other electronic components in the high-frequency circuit, and thereby achieve high packaging density of the high-frequency circuit.

According to still another aspect of the present invention, the first microstrip line connected by the chip jumper is connected to a band-pass filter. In this arrangement, it is possible to prevent the ground plane for the microstrip lines from becoming discontinuous, prevent the bandwidth provided by the band-pass filter from becoming narrower, and thereby realize a high-frequency circuit suitable for a wideband use.

According to still another aspect of the present invention, the chip jumper is a metal plate. In this arrangement, it is possible to miniaturize the high-frequency circuit and realize a low-cost high-frequency circuit suitable for a wideband use.

According to still another aspect of the present invention, the chip jumper is a chip capacitor. In this arrangement, it is possible to use a chip capacitor as a coupling capacitor that is required for composing a high-frequency circuit and thereby realize further miniaturization of the high-frequency circuit without increasing a number of components.

According to still another aspect of the present invention, the chip jumper is a chip inductor. In this arrangement, the chip inductor serves as the impedance matching component to be used to improve reflection characteristics when signals are fed from the microstrip line to an electronic circuit. Therefore, it is possible to achieve a further reduction in size of the high-frequency circuit without increasing a number of components.

According to still another aspect of the present invention, the chip jumper is a chip resistor. In this arrangement, the chip resistor serves as the impedance matching component to be used to improve reflection characteristics when signals are fed from the microstrip line to an electronic circuit. Therefore, it is possible to achieve a further reduction in size of the high-frequency circuit without increasing a number of components.

According to still another aspect of the present invention, the first ground pattern and the second ground pattern are connected together electrically by way of a through hole. In this arrangement, it is possible to realize an electrical connection easily between the first and the second ground patterns and achieve a further reduction in size of the high-frequency circuit without increasing a number of components.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 8:
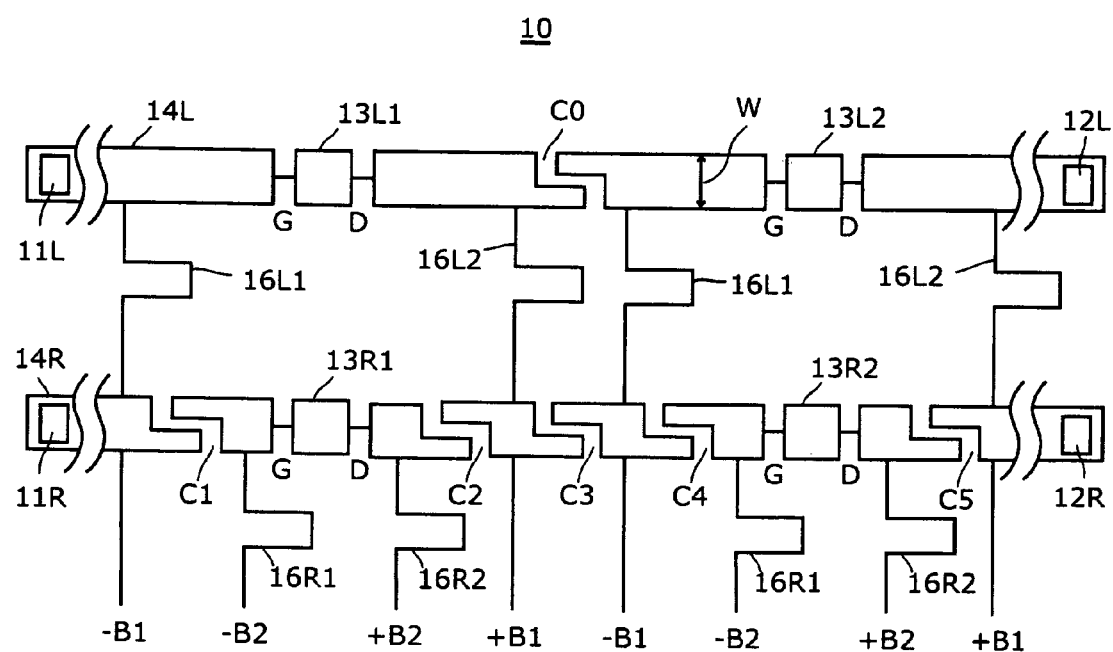
FIG. 8 is a schematic diagram showing a configuration of a conventional high-frequency circuit.
Figure 9:
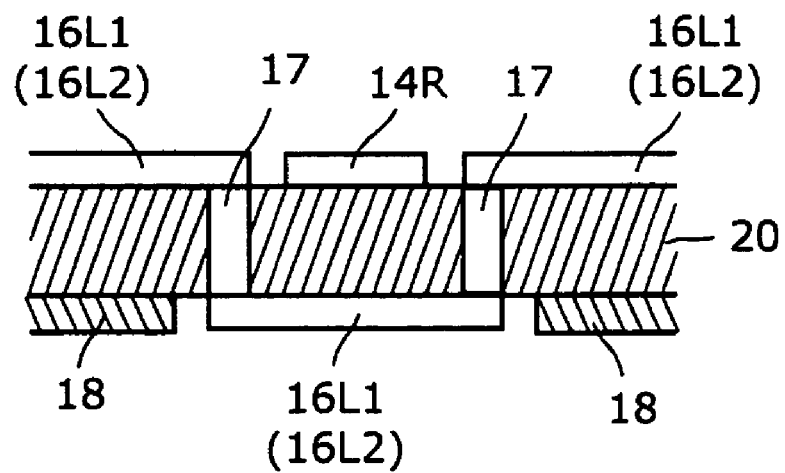
FIG. 9 is a sectional view showing a portion where a bias line 16L1 and a microstrip line 14R of the conventional low-noise high-frequency amplifier cross each other.

Hereinafter, embodiments of the present invention will be described with reference to the accompanying drawings. In FIG. 1 to FIG. 7, such components as are found also in FIG. 8 and FIG. 9 are identified with the same reference numerals.

Figure 1:
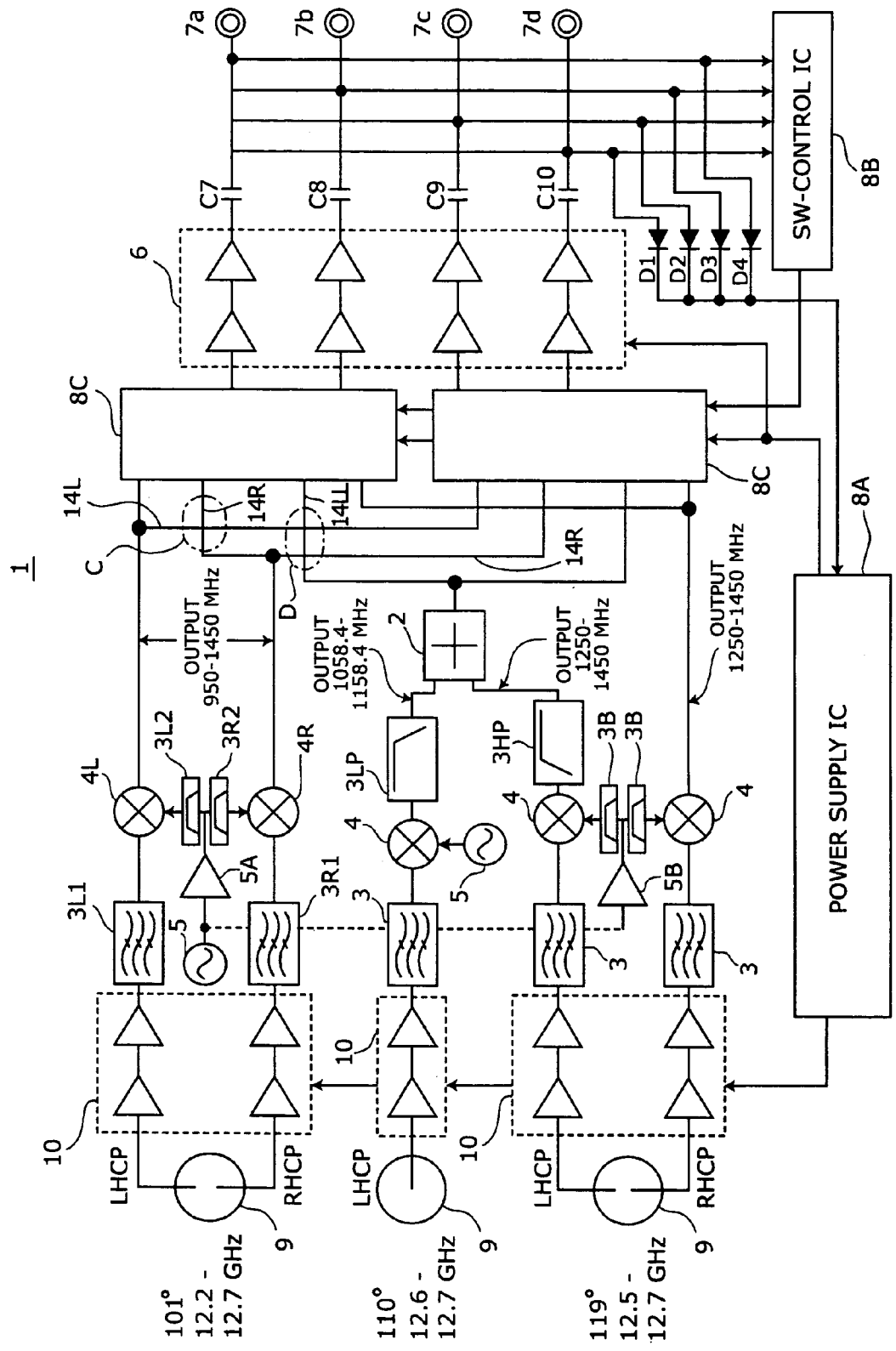
FIG. 1 is a schematic diagram showing an LNB (low-noise block down-converter) having a high-frequency circuit embodying the invention.

FIG. 1 is a schematic diagram showing an LNB (low-noise block down-converter) having a high-frequency circuit embodying the invention. An LNB 1 comprises an antenna 9, low-noise high-frequency amplifiers 10, band-pass filters 3, 3B, 3L1, 3R1, 3L2, and 3R2, a low-pass filter 3LP, a high-pass filter 3HP, mixers 4, 4L, and 4R, local oscillators 5, local-frequency amplifiers 5A and 5B, a coupler 2, an intermediate-frequency amplifier 6, a power supply 8A comprising a power supply IC, a controller 8B comprising a SW (switching) control IC, and a controller 8C. The antenna 9 receives signals transmitted from three satellites in geostationary orbits at 101 degrees, 110 degrees, and 119 degrees east longitude respectively.

With respect to receiving from the satellite at 101 degrees, RF (radio-frequency) signals in a frequency band of 12.2 GHz to 12.7 GHz consisting of left-handed and right-handed polarized waves received by the antenna 9 are amplified respectively by the low-noise high-frequency amplifier 10. The amplified signals are fed to the mixers 4L and 4R through the band-pass filters 3L1 and 3R1 that allow signals of predetermined frequencies to pass through. At the same time, a local frequency signal (11.25 GHz) generated by the local oscillator 5 is amplified by the local-frequency amplifier 5A and fed to the mixers 4L and 4R through the band-pass filters 3L2 and 3R2. The mixers 4L and 4R convert the received signals into IF (intermediate-frequency) signals in frequencies ranging from 950 MHz to 1,450 MHz based on the local frequency of 11.25 GHz generated by the local oscillator.

Next, with respect to receiving from the satellite at 110 degrees, the RF signal in a frequency band of 12.6 GHz to 12.7 GHz in the form of left-handed polarized wave received by the antenna 9 is amplified by the low-noise high-frequency amplifier 10. The amplified signal is fed to the mixer 4 through the band-pass filter 3 that allows a signal of predetermined frequencies to pass through. Then, the mixer 4 mixes a local-frequency signal (11.5416 GHz) generated by the local oscillator 5 and the amplified RF signal, converts into an IF signal in frequencies ranging from 1058.4 MHz to 1158.4 MHz, and feeds out the IF signal. Thereafter, the IF signal is fed to the coupler 2 through the low-pass filter 3LP.

Next, with respect to receiving from the satellite at 119 degrees, RF signals in a frequency band of 12.5 GHz to 12.7 GHz consisting of left-handed and right-handed polarized waves received by the antenna 9 are amplified respectively by the low-noise high-frequency amplifier 10. The amplified signals are fed to the mixers 4 through the band-pass filters 3 that allow signals of predetermined frequencies to pass through. At the same time, a local frequency signal (11.25 GHz) generated by the local oscillator 5 is amplified by the local-frequency amplifier 5B and fed to the mixers 4 through the band-pass filters 3B. The mixers 4 convert the received signals into IF signals in frequencies ranging from 1,250 MHz to 1,450 MHz based on the local frequency of 11.25 GHz and feed out the converted IF signals. Thereafter, the IF signal in the form of left-handed polarized wave transmitted from the satellite at 119 degrees is fed to the coupler 2 through the high-pass filter 3HP.

The coupler 2 couples the IF signals in the form of left-handed polarized wave received from the satellites at 110 degrees and 119 degrees respectively and converts into an IF signal having a frequency different therefrom. As a result, five different signals received from the three satellites at 101 degrees, 110 degrees, and 119 degrees respectively are converted into four different IF signals. The controllers 8B and 8C select a signal or signals among the four converted IF signals and choose an output terminal or terminals among output terminals 7a to 7d for outputting the selected signal or signals. The selected signal or signals are amplified by the intermediate-frequency amplifier 6 and fed out from the output terminals 7a to 7d through coupling capacitors C7 to C10.

Each of the output terminals 7a to 7d is connected to the controller 8B. Furthermore, the output terminal 7a is connected to an anode of a diode D4; the output terminal 7b is connected to an anode of a diode D3; the output terminal 7c is connected to an anode of a diode D2; and the output terminal 7d is connected to an anode of a diode D1. Then, cathodes of the diodes D1 to D4 are short-circuited and connected to the power supply 8A. A DC voltage is applied to each of the output terminals 7a to 7d through an unillustrated tuner circuit, and the power supply 8A is designed to supply power based on the applied DC voltage to the low-noise high-frequency amplifiers 10, the intermediate-frequency amplifier 6, and the controller 8C.

Figure 2:
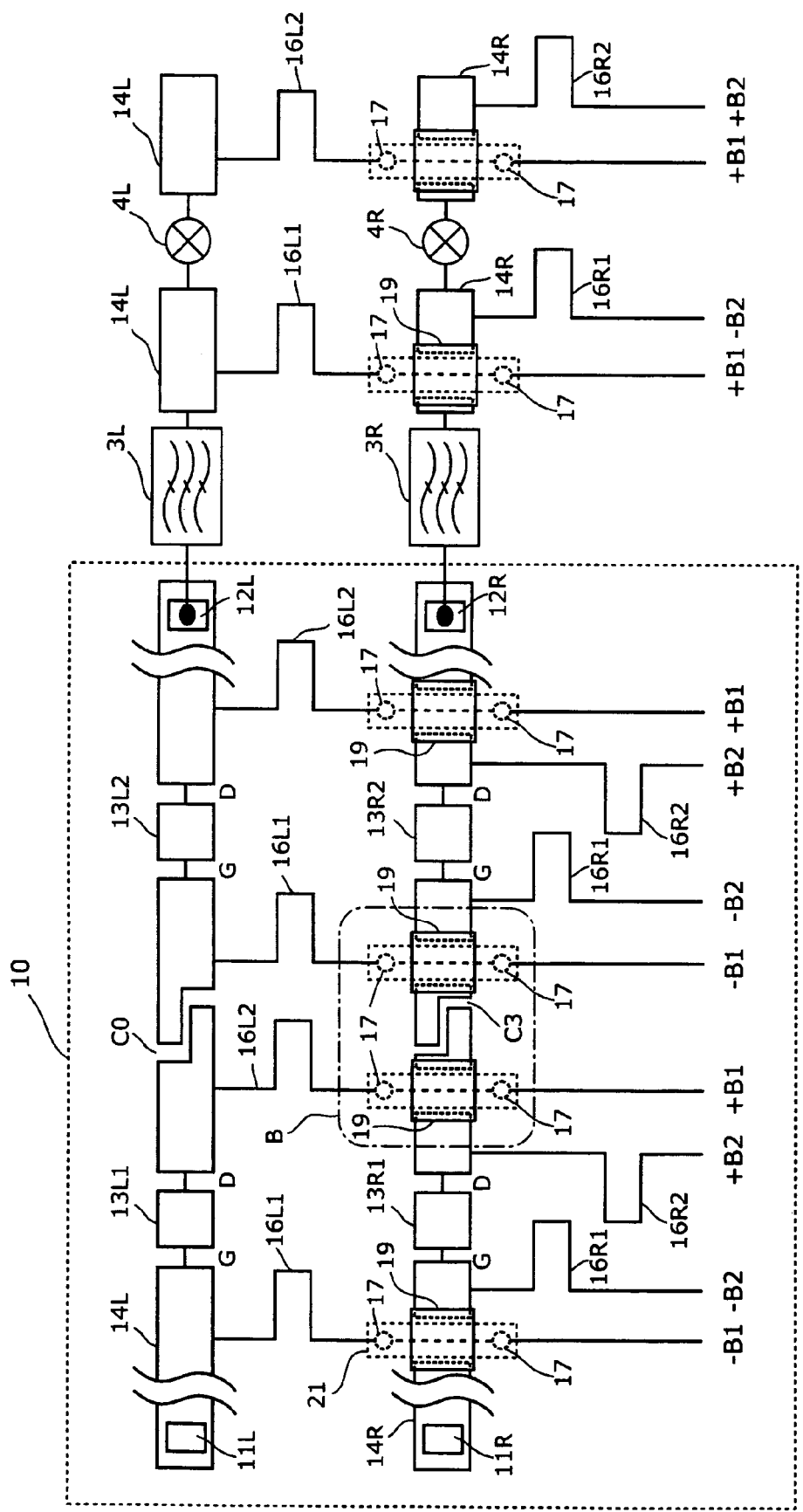
FIG. 2 is a schematic diagram showing a configuration of an LNB having a high-frequency circuit of a first embodiment of the invention.

FIG. 2 is a schematic diagram showing a configuration of an LNB having a high-frequency circuit of a first embodiment of the invention. In FIG. 2, such components as are found also in FIG. 1 and FIG. 8 are identified with the same reference numerals. Reference numeral 10 represents a low-noise high-frequency amplifier. RF signals in a 12 GHz frequency band in the form of left-handed polarized wave and right-handed polarized wave received by the antenna 9 (shown in FIG. 1) are fed to microstrip lines 14L and 14R through input terminals 11L and 11R respectively.

The RF signal in the form of left-handed polarized wave that is fed through the input terminal 11L is outputted from an output terminal 12L after having been amplified by two amplifiers 13L1 and 13L2 built in the microstrip line 14L, and fed to a band-pass filter 3L that allows a signal of predetermined frequencies to pass through. Then, the signal fed from the band-pass filter 3L is fed to a mixer 4L through the microstrip line 14L, and the signal fed from the mixer 4L is outputted through the microstrip line 14L.

On the other hand, the RF signal in the form of right-handed polarized wave that is fed through the input terminal 11R is outputted from an output terminal 12R after having been amplified by two amplifiers 13R1 and 13R2 built in the microstrip line 14R, and fed to a band-pass filter 3R that allows a signal of predetermined frequencies to pass through. Then, the signal fed from the band-pass filter 3R is fed to a mixer 4R through the microstrip line 14R, and the signal fed from the mixer 4R is outputted through the microstrip line 14R.

Each of the amplifiers 13L1, 13L2, 13R1, and 13R2 comprises a GaAsFET (Gallium Arsenide Field-Effect Transistor). A coupling capacitor C0 for preventing a DC component from passing therethrough is formed between the amplifiers 13L1 and 13L2 as a part of the microstrip line 14L. Also, a coupling capacitor C3 for preventing a DC component from passing therethrough is formed between the amplifiers 13R1 and 13R2 as a part of the microstrip line 14R.

The amplifiers 13R1 and 13R2 are designed to amplify a signal fed to a gate G thereof and to output the signal from a drain D thereof when, for example, bias voltages −B2 and +B2 are applied to the gate G and the drain D through bias lines 16R1 and 16R2 respectively. In this case, a source of the GaAsFET is connected to ground (not illustrated). Also, the mixer 4R is designed to convert the RF signal that is fed therein into an IF signal having a predetermined frequency based on a local oscillation frequency generated by an un illustrated local oscillator and outputs the converted signal when, for example, the bias voltages −B2 and +B2 are applied to input and output portions of the mixer 4R through the bias lines 16R1 and 16R2 respectively.

Bias lines 16L1 and 16L2 of which portions are formed on a reverse side of a substrate are arranged to cross, in plan view, the microstrip line 14R that is formed on an obverse side of the substrate. Portions of the bias lines 16L1 and 16L2 formed on the obverse side are electrically connected continuously to the portions of the bias lines 16L1 and 16L2 formed on the reverse side by way of through holes 17.

In this arrangement, the amplifiers 13L1 and 13L2 amplify a signal fed to a gate G thereof and output the signal from a drain D thereof when, for example, bias voltages −B1 and +B1 are applied to the gate G and the drain D through the bias lines 16L1 and 16L2 respectively. Furthermore, the mixer 4L is designed to convert the RF signal that is fed therein into an IF signal having a predetermined frequency based on a local oscillation frequency generated by an un illustrated local oscillator and outputs the converted signal when, for example, the bias voltages −B1 and +B1 are applied to input and output portions of the mixer 4L through the bias lines 16L1 and 16L2 respectively.

In this embodiment, contrary to the conventional circuit as shown in FIG. 8, it is not required to form the capacitors C1, C2, C4, and C5 by segmenting the microstrip line 14R so as to separate each bias line from each other as an independent DC line even in the case where the bias lines 16L1 and 16L2 are arranged to cross the microstrip line 14R in plan view.

As a result, it is possible to shorten the microstrip line 14R and thereby shorten the overall length of the microstrip line 14L because the distance between the bias lines 16L1 and 16L2 can be made smaller. This contributes to miniaturizing the low-noise high-frequency amplifier 10 comprising an MIC.

Figure 3A:
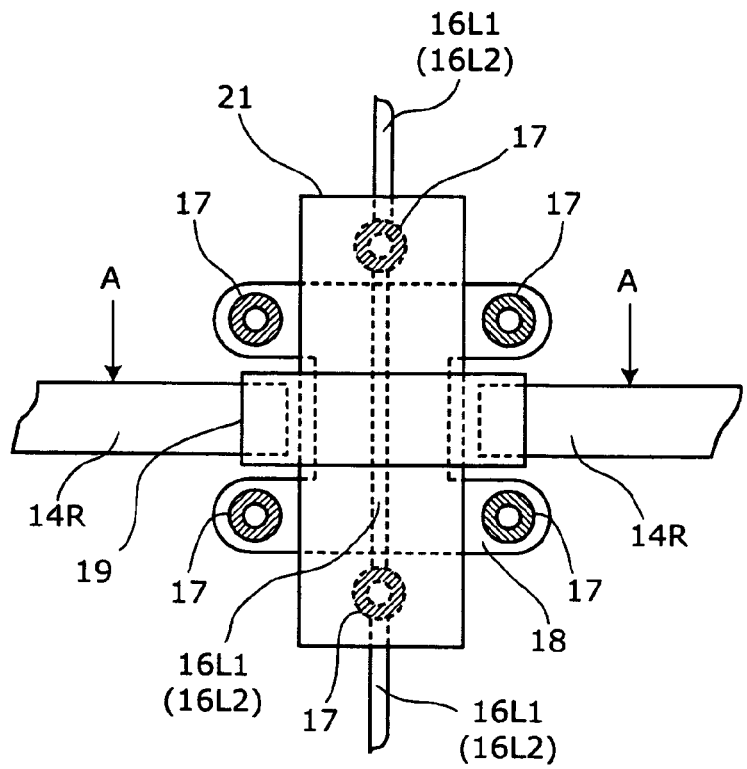
FIG. 3A is a plan view showing a structure at the intersection of the bias line 16L1 (or 16L2) and the microstrip line 14R.
Figure 3B:
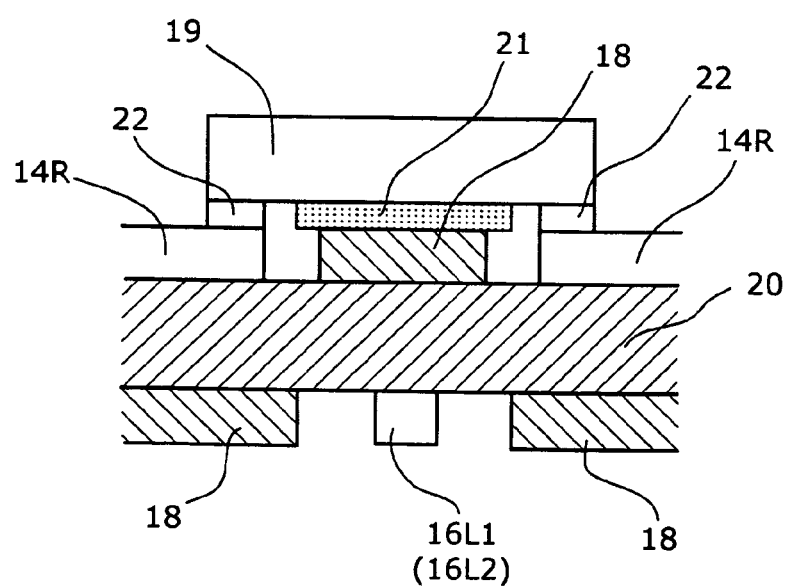
FIG. 3B is a diagram showing a cross section of A—A shown in FIG. 3A.

FIG. 3A is a plan view showing a structure at the intersection of the bias line 16L1 (or 16L2) and the microstrip line 14R. FIG. 3B is a diagram showing a cross section of A—A shown in FIG. 3A. As shown in FIG. 3B, the microstrip line 14R is formed on the obverse side of the substrate 20. Reference numeral 18 represents a ground pattern formed on almost the entire reverse side of the substrate 20. However, the ground pattern 18 is removed from portions surrounding the bias lines 16L1 and 16L2 formed on the reverse side of the substrate 20.

Moreover, the pattern of the microstrip line 14R is divided by a portion of the ground pattern 18 formed on the obverse side of the substrate 20. A chip jumper 19, a conductor, is placed over the ground pattern 18 formed on the obverse side of the substrate 20 so as to connect the divided portions of the microstrip line 14R. By doing so, the microstrip line 14R and the chip jumper 19 are connected continuously through connecting portions 22 that are arranged on the pattern of the microstrip line 14R. At the same time, an insulating film 21 is placed between the chip jumper 19 and the ground pattern 18 so as to avoid a short circuit therebetween. It is also possible to provide a gap therebetween instead of placing the insulating film 21.

In addition, the ground pattern 18 formed on the obverse side of the substrate 20 is connected continuously to the ground pattern 18 formed on almost the entire reverse side of the substrate 20 by way of the through holes 17. A portion of each of the bias lines 16L1 and 16L2 is formed on the side opposite to the side on which the ground pattern 18 dividing the microstrip line 14R is formed.

According to this structure, in a case where the ground plane for the microstrip line 14R is disrupted by the bias lines 16L1 and 16L2 on the reverse side of the substrate 20, it is possible to maintain a continuous ground plane for the microstrip line 14R by providing the ground pattern 18 formed on the obverse side of the substrate 20 as the ground plane. As a result, it is possible to solve the problem of the discontinuity of the ground plane for the microstrip line 14R, thereby prevent the bandwidth from becoming narrower, and transmit high-frequency signals.

Figure 4:
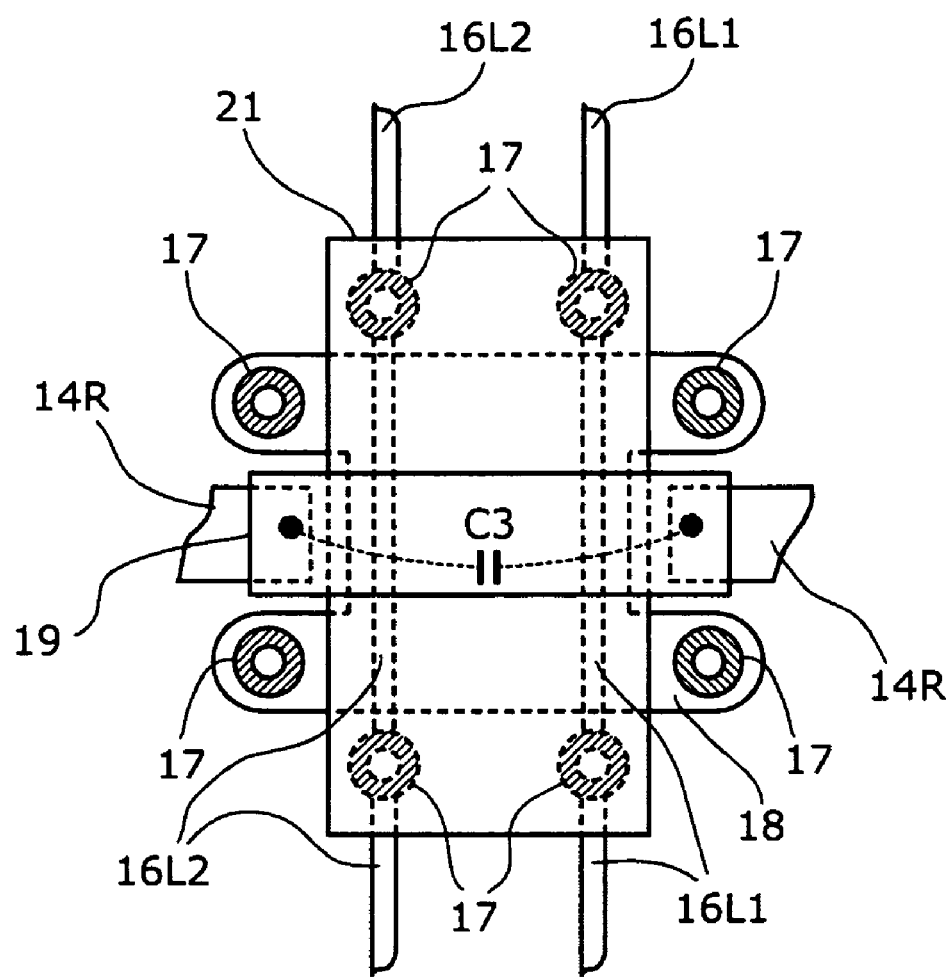
FIG. 4 is a detailed view of a portion B shown in FIG. 2.

FIG. 4 is a detailed view of a portion B shown in FIG. 2. As illustrated, a chip capacitor is used as the chip jumper 19 so that the coupling capacitor C3 (FIG. 2), necessary for arranging the circuit of the low-noise high-frequency amplifier 10, is not formed by a gap which elongates the microstrip line 14R. In other words, the ground pattern 18 is formed under the chip capacitor C3 which is in the form of the chip jumper 19, and portions of the bias lines 16L1 and 16L2 are formed on the reverse side. In this way, it is possible to further miniaturize the circuit without increasing a number of components.

Figure 5:
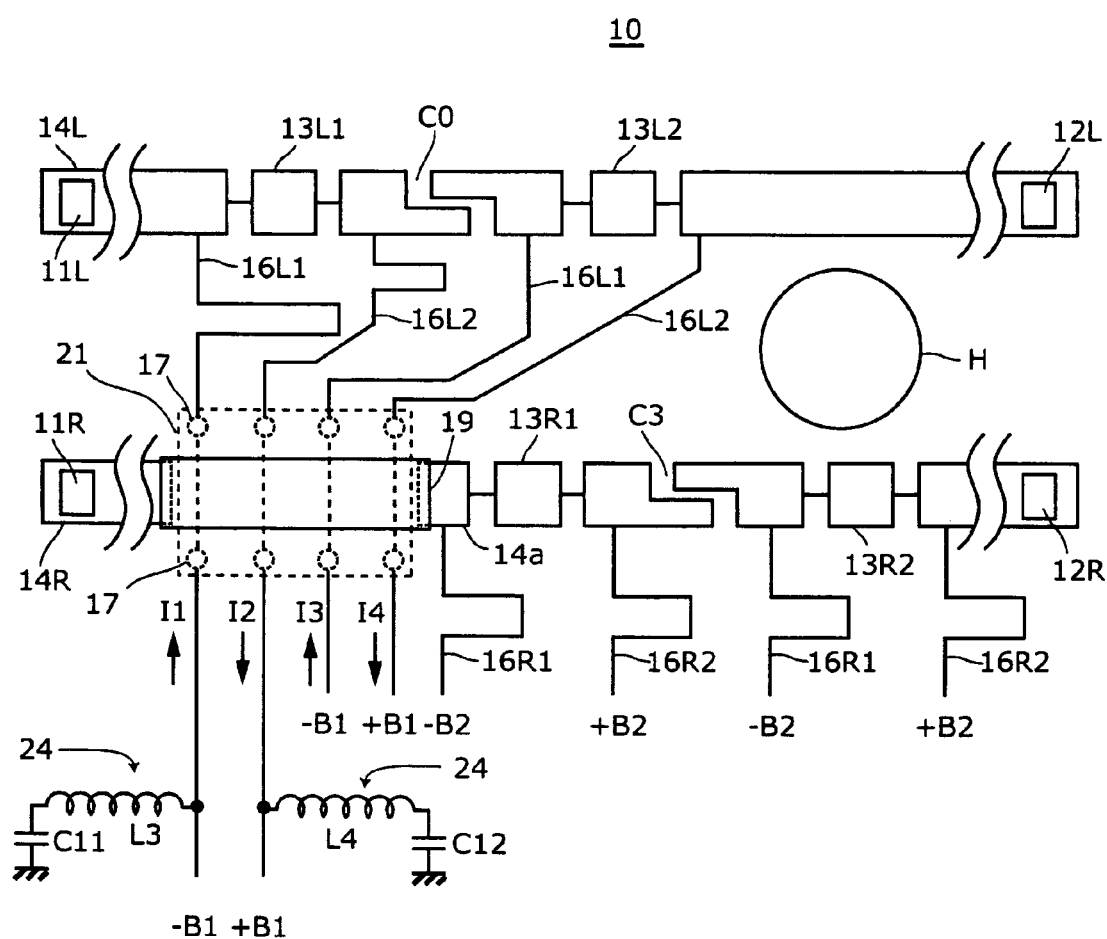
FIG. 5 is a schematic diagram showing a configuration of an LNB having a high-frequency circuit of a second embodiment of the invention.

FIG. 5 is a schematic diagram showing a configuration of an LNB having a high-frequency circuit of a second embodiment of the invention. A low-noise high-frequency amplifier 10 works in the same manner as the corresponding circuit of the first embodiment shown in FIG. 2 as previously described. Amplifiers 13L1 and 13L2 built in a microstrip line 14L receive bias voltages through bias lines 16L1 and 16L2.

The bias lines 16L1 and 16L2 extend to a reverse side of a substrate 20 (FIGS. 3A and 3B) via through holes 17 as is the case in the first embodiment. In this case, four bias lines 16L1 and 16L2 cross, in plan view, a chip jumper 19. Because of this layout, it is possible to allocate a larger space to an area H as illustrated and mount other electronic components in this area H, contributing to realizing a high-density packaging of the low-noise high-frequency amplifier 10. It is to be noted that portions of the bias lines 16L1 and 16L2 are arranged in an oblique angle so that the bias lines will be equal in length.

As shown by arrows in FIG. 5, a direction of current I1, I2, I3, or I4 flowing through any one of the bias lines 16L1 and 16L2 is opposite to a direction of current flowing through the adjacent bias line. In this arrangement, magnetic fields generated by the currents I1 to I4 flowing through the bias lines 16L1 and 16L2 cancel each other, resulting in a reduction of the magnetic fields that affect the microstrip line 14R.

Another adverse effect that may influence other circuits through the bias lines 16L1 and 16L2 is caused by signals being transferred from the microstrip line 14R to the bias lines 16L1 and 16L2 that are formed on the reverse side of the substrate 20. To overcome this problem, filters 24 comprising coils L3 and L4, and capacitors C11 and 12 are connected to the bias lines 16L1 and 16L2 respectively so as to remove the transferred signals and alleviate the adverse effects that will otherwise influence the other circuits.

Moreover, there is a case in which, for example as shown by a portion C in FIG. 1, signal lines, i.e., the microstrip lines, cross each other before the IF signals are fed to the controller 8C, because a plurality of signals are converted into a plurality of IF signals by the mixers 4, 4R, and 4L. In such a high-frequency circuit having a layout in which the microstrip lines cross each other, an identical structure as described above with respect to intersection of the microstrip line and the bias line is also applicable to the crossed microstrip lines.

Figure 6A:
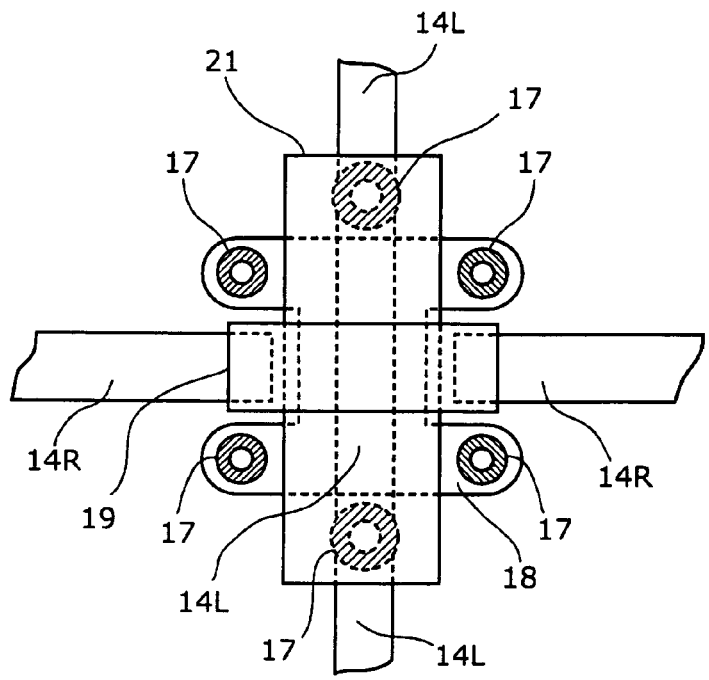
FIG. 6A is a detailed view of a portion C shown in FIG. 1.

FIG. 6A is a detailed view of a portion C shown in FIG. 1. This example is for a case in which the microstrip line 14R to be connected to the controller 8C crosses the microstrip line 14L in plan view. According to this structure, the ground plane for one microstrip line is not disrupted by another microstrip line. Therefore, it is possible to eliminate discontinuity of the ground plane for the microstrip line and, without narrowing the bandwidth, realize a high-frequency circuit suitable for a wide bandwidth even in a high-frequency circuit having a crossing point of the microstrip lines.

Additionally, in such a high-frequency circuit having a layout of the crossed microstrip lines 14R and 14L as described above, it is also possible to reduce interference of signals between the crossing microstrip lines 14R and 14L, because the ground pattern 18 is provided between the microstrip line 14R and the microstrip line 14L in an area in which the microstrip lines 14R and 14L cross each other.

Figure 6B:
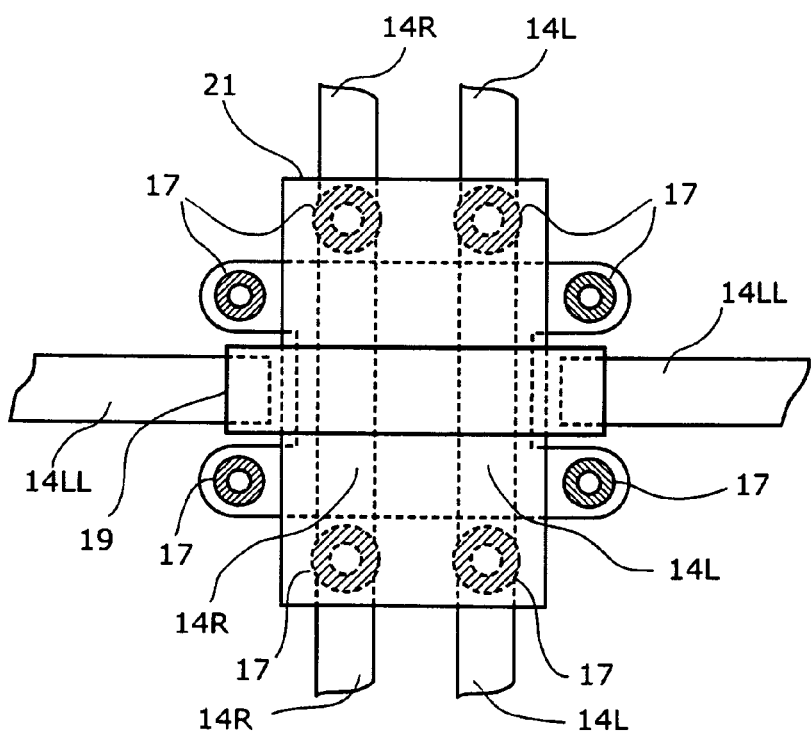
FIG. 6B is a detailed view of a portion D shown in FIG. 1.

FIG. 6B is a detailed view of a portion D shown in FIG. 1. This example is for a case in which the microstrip line 14LL to be connected to the controller 8C crosses the microstrip lines 14R and 14L in plan view. According to this structure, the ground plane for one microstrip line is not disrupted by another microstrip line. Therefore, it is possible to eliminate discontinuity of the ground plane for the microstrip line and, without narrowing the bandwidth, realize a high-frequency circuit suitable for a wide bandwidth even in a high-frequency circuit having a crossing point of the microstrip lines.

Additionally, in such a high-frequency circuit having a layout of crossing microstrip line 14LL and two microstrip lines 14R, 14L as described above, it is also possible to reduce interference of signals between the microstrip line 14LL and the two microstrip lines 14R, 14L, because the ground pattern 18 is provided between the microstrip line 14LL and the two microstrip lines 14R, 14L in an area in which the microstrip lines cross each other.

Furthermore, as shown in FIG. 2, the bias lines 16L1 and 16L2 are arranged to cross, in plain view, portions of the microstrip lines 14R to be connected to the band-pass filter 3R. In this arrangement, it is possible to prevent the ground plane for the microstrip line 14R to be connected to the band-pass filter 3R from being divided by the bias lines 16L1 and 16L2 and becoming discontinuous. As a result of this, it is also possible to prevent the bandwidth provided by the band-pass filter 3R from becoming narrower.

Figure 7A:
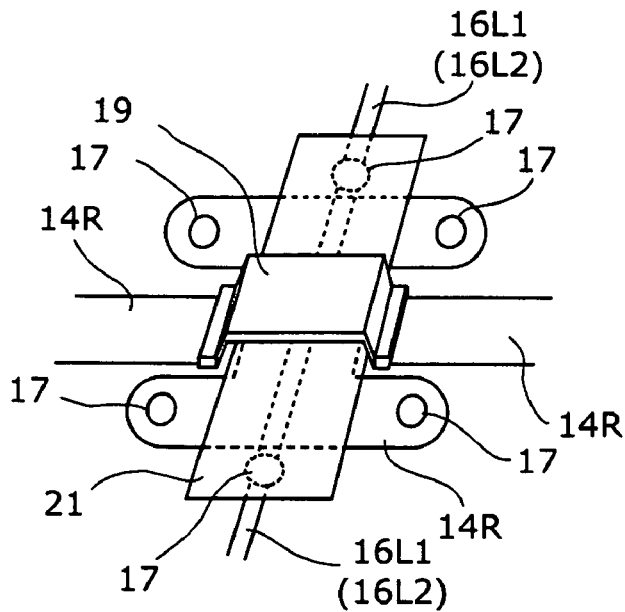
FIG. 7A is a diagram showing a metal plate used as a chip jumper.
Figure 7B:
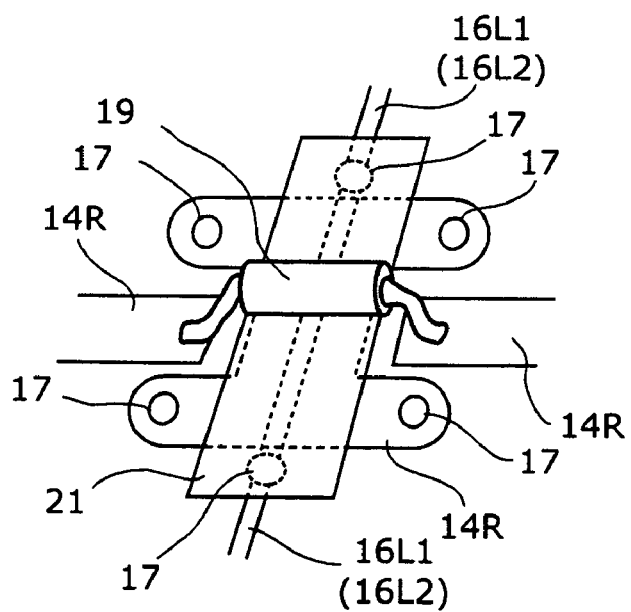
FIG. 7B is a diagram showing a chip capacitor, chip inductor, or a chip resistor used as a chip jumper.

Moreover, in the high-frequency circuit described before, it is possible to replace the chip jumper 19 with a metal plate as shown in FIG. 7A and, thereby, achieve a reduction in the cost of the high-frequency circuit. It is also possible to replace the chip jumper 19 with a chip capacitor as shown in FIG. 7B so that the chip capacitor can be used as the coupling capacitor C3 as explained before and, thereby achieve a further reduction in the size of the high-frequency circuit without increasing a number of components.

It is sometimes a practice to insert a chip inductor or a chip resistor for impedance matching so as to improve reflection characteristics when a high-frequency signal is fed to such an electronic component as the amplifier 13R1 or 13R2 through the microstrip line. It is also possible to use a chip inductor or a chip resistor instead of the chip jumper 19 as shown in FIG. 7B so that the chip inductor or the chip resistor serves as the impedance matching component and, thereby, achieve further miniaturization of the high-frequency circuit without increasing a number of components.

Although the low-noise high-frequency amplifier of the LNB has been described, it is also possible, for obtaining the same results, to adopt the aforementioned structure into any other high-frequency circuits in which the microstrip line is arranged to cross the bias line or another microstrip line.

According to one aspect of the present invention, it is possible to eliminate discontinuity of the ground plane for the microstrip line caused as a result of forming the bias line on the reverse side of the substrate, and thereby achieve miniaturization and high packaging density of the high-frequency circuit without narrowing the bandwidth for the signal propagating through the microstrip line.

According to another aspect of the present invention, it is possible to adopt the present invention into a high-frequency circuit in which a microstrip line is so arranged as to cross another microstrip line, provide a wide bandwidth without narrowing a bandwidth for a signal propagating through the microstrip line, and thereby realize a high-frequency circuit that allows a high-density packaging. It is also possible to reduce interference, at the intersection, between signals propagating through the microstrip lines that are arranged to cross each other.

What is claimed is:

1. A high-frequency circuit comprising:
   a substrate having an electronic component on an obverse side thereof;
   a first ground pattern formed on almost an entire reverse side of the substrate;
   a microstrip line formed on the obverse side of the substrate; and
   a bias line connected to the electronic component on the obverse side of the substrate and formed continuously on the obverse side and the reverse side of the substrate so as to cross the microstrip line on the reverse side of the substrate in plan view so as to supply a bias voltage to the electronic component,
   wherein the first ground pattern is formed so as to circumvent the bias line formed on the reverse side of the substrate;
   a portion of the first ground pattern that circumvents the bias line on the reverse side of the substrate is continuously formed on the obverse side of the substrate as a second ground pattern so as to divide the microstrip line in two parts; and
   a chip jumper is arranged to bridge the two divided parts of the microstrip line over the second ground pattern so as to connect the divided microstrip line electrically.

2. A high-frequency circuit as claimed in claim 1, wherein a plurality of bias lines are formed so as to cross, in plan view, the chip jumper arranged to bridge the two divided parts of the microstrip line.

3. A high-frequency circuit as claimed in claim 1, wherein the microstrip line connected by the chip jumper is connected to a band-pass filter.

4. A high-frequency circuit as claimed in claim 1, wherein the chip jumper is a metal plate.

5. A high-frequency circuit as claimed in claim 1, wherein the chip jumper is a chip capacitor.

6. A high-frequency circuit as claimed in claim 1, wherein the chip jumper is a chip inductor.

7. A high-frequency circuit as claimed in claim 1, wherein the chip jumper is a chip resistor.

8. A high-frequency circuit as claimed in claim 1, wherein the first ground pattern and the second ground pattern are connected together electrically by way of a through hole.

9. A high-frequency circuit having a substrate, a first ground pattern formed on almost an entire reverse side of the substrate, and a first microstrip line and a second microstrip line formed on the substrate,
   wherein the first microstrip line is formed on an obverse side of the substrate;
   the second microstrip line is formed continuously on the obverse side and the reverse side of the substrate so as to cross the first microstrip line on the reverse side of the substrate in plan view;
   the first ground pattern is formed so as to circumvent the second microstrip line formed on the reverse side of the substrate;
   a portion of the first ground pattern that circumvents the first microstrip line on the reverse side of the substrate is continuously formed on the obverse side of the substrate as a second ground pattern so as to divide the first microstrip line in two parts; and
   a chip jumper is arranged to bridge the two divided parts of the first microstrip line over the second ground pattern so as to electrically connect the divided two parts of the first microstrip line.

10. A high-frequency circuit as claimed in claim 9, wherein a plurality of second microstrip lines are formed so as to cross, in plan view, the chip jumper arranged to bridge the two divided parts of the first microstrip line.

11. A high-frequency circuit as claimed in claim 9, wherein the first microstrip line connected by the chip jumper is connected to a band-pass filter.

12. A high-frequency circuit as claimed in claim 9, wherein the chip jumper is a metal plate.

13. A high-frequency circuit as claimed in claim 9, wherein the chip jumper is a chip capacitor.

14. A high-frequency circuit as claimed in claim 9, wherein the chip jumper is a chip inductor.

15. A high-frequency circuit as claimed in claim 9, wherein the chip jumper is a chip resistor.

16. A high-frequency circuit as claimed in claim 9, wherein the first ground pattern and the second ground pattern are connected together electrically by way of a through hole.

* * * * *